United States Patent [19]

Lee et al.

[11] Patent Number: 5,712,612

[45] Date of Patent: Jan. 27, 1998

[54] TUNNELING FERRIMAGNETIC MAGNETORESISTIVE SENSOR

[75] Inventors: Gregory S. Lee, Mountain View; Erji Mao, Stanford, both of Calif.

[73] Assignee: Hewlett-Packard Company, Palo Alto, Calif.

[21] Appl. No.: 581,815

[22] Filed: Jan. 2, 1996

[51] Int. Cl.⁶ .................................................. H01L 43/00
[52] U.S. Cl. ...................... 338/32 R; 338/32 H; 324/252; 360/113
[58] Field of Search ...................... 338/32, 34, 32 H; 323/294; 324/207.11, 252; 257/108, 414, 421–427; 360/113, 55, 135

[56] References Cited

U.S. PATENT DOCUMENTS

| | | | |
|---|---|---|---|
| 4,624,901 | 11/1986 | Glass | 428/469 |
| 4,827,218 | 5/1989 | Meunier et al. | 324/252 |
| 5,260,653 | 11/1993 | Smith et al. | 324/252 |
| 5,390,061 | 2/1995 | Nakatani et al. | 360/113 |
| 5,406,433 | 4/1995 | Smith | 360/113 |
| 5,583,727 | 12/1996 | Parkin | 360/113 |
| 5,600,297 | 2/1997 | Ruigrok et al. | 338/32 R |

*Primary Examiner*—Tu B. Hoang
*Attorney, Agent, or Firm*—Ian Hardcastle

[57] ABSTRACT

A tunneling ferrimagnetic magnetoresistive sensor that has a ΔR/R greater than that of known magnetoresistive sensors, and that, with appropriate electrode materials, can undergo a substantial change in resistance in response to a magnetic field in the intensity range of 10s of Oe, which is typical of the intensity of the magnetic fields encountered in magnetic recording media such as discs and tapes. The tunneling ferrimagnetic magnetoresistive sensor is composed of a stack of thin-film layers that include a layer of a ferrimagnetic material, a layer of a magnetic material, and a layer of an insulator interposed between the layer of the ferrimagnetic material and the layer of the magnetic material. The ferrimagnetic material is conductive. The magnetic material is also conductive and has a coercivity substantially different from that of the ferrimagnetic material. The insulating layer is of a thickness that is sufficiently small to permit tunneling of current carriers between the layer of the ferrimagnetic material and the layer of the magnetic material.

24 Claims, 5 Drawing Sheets

TUNNELING FERRIMAGNETIC MAGNETORESISTIVE SENSOR

FIELD OF THE INVENTION

The invention relates to magnetic sensors, and, in particular to magnetoresistive magnetic sensors.

BACKGROUND OF THE INVENTION

Inductive sensors based on electromagnetic induction are widely used in many applications to generate an electrical signal in response to the intensity of a magnetic field. For example, inductive read heads are used to reproduce information signals magnetically recorded as field strength variations in a magnetic recording medium, such as a tape or disc. In these recording applications, as well as in many other applications, inductive sensors have recently been subject to substantial miniaturization to enable them to respond to magnetic field variations of ever smaller physical dimensions. Miniaturizing the inductive sensor enables the demand for large increases in recording density to be met, for example. However, miniaturizing the inductive sensor and its pick-up coil, and the corresponding reductions in the amount of magnetic material to which the sensor is responsive, result in a reduction in the signal-to-noise ratio of the electrical signal generated by the sensor. Since the level of the electrical signal depends on the relative velocity between the sensor and the magnetic medium, some of the reduction in the signal-to-noise ratio can be recovered by increasing this velocity. However, practical limitations on this velocity limit how much miniaturization can be achieved consistent with the electrical signal having an acceptable signal-to-noise ratio.

Magnetoresistive (MR) sensors offer an alternative to inductive sensors for generating an electrical signal having an acceptable signal-to-noise ratio in response to small-scale magnetic fields, such as the magnetic fields generated by the bits recorded on a computer disc. Unlike inductive sensors, the electrical signal generated by an MR sensor depends only on the smile value of the magnetic field, and is independent of the relative velocity between the sensor and the recording medium.

Early magnetoresistive sensors were based on so-called anisotropic magnetoresistance (AMR). However, the electrical signal generated by AMR-based sensors has a low signal-to-noise ratio because the magnetoresistance change $\Delta R/R$ is only a few percent over a practical range of magnetic field intensities. As a result, AMR-based sensors require complex decoding circuitry to decode the electrical signal generated by the sensor. The $\Delta R/R$ should be as large as possible to maximize the signal-to-noise ratio.

Giant magnetoresistance (GMR) is a recently-discovered phenomenon that occurs in a variety of material systems such as magnetic/non-magnetic multilayers, magnetic granular composites, and manganese-based perovskites. By commonly-accepted definition, GMR means $\Delta R/R > 10\%$. The largest resistance change occurs in manganese perovskites, where $\Delta R/R$ can approach 100%. Such materials are said to exhibit "colossal magnetoresistance" or CMR. Unfortunately, to produce such changes in resistance, field excursions of about 8 Tesla are required. This is about four orders of magnitude greater than the field intensities typical of magnetic recording media.

GMR sensors based on multilayers have a large $\Delta R/R$ at low temperatures, but typically have a $\Delta R/R$ of only about 10% at room temperature.

MR sensors based on all these systems (GMR multilayers, GMR granular composites, CMR bulk perovskites) are conventionally operated with the magnetic field and the current flow in the plane of the film.

Most recently, in 74 PHYS. REV. LETT., 3273-3276, (1995), J. S. Moodera, L. R. Kinder, T. M. Wong, and R. Meservey have described ferromagnet-insulator-ferromagnet (FM-I-FM) tunnel junction devices that exhibit GMR. In these devices, a pair of ferromagnetic electrodes with nonidentical coercivities $H_c$ sandwiches an insulating layer that is sufficiently thin to permit conduction by tunneling. Transition metals and their alloys are used as the pair of ferromagnetic electrodes: for example, cobalt and iron, cobalt and cobalt-iron or cobalt and nickel-iron may be used. Sensors of this type are operated with the magnetic field parallel to the plane of the tunnel junction. Current is conducted transversely to the plane of the tunnel junction from one metal electrode to the other by tunneling through the insulating layer.

When an FM-I-FM sensor is subject to an external magnetic field, the direction of magnetization of the electrode with the higher $H_c$ (the "hard" ferromagnet) stays fixed relative to the external field whereas that of the electrode with the lower $H_c$ (the "soft" ferromagnet) aligns itself to the direction of the external field. Because magnetization is a macroscopic manifestation of the electrons' spin alignment, and because tunneling is a spin-conserving process, a large tunneling current (low resistance state) typically flows when the directions of magnetization of the electrodes bounding the tunneling junction are parallel, and a small tunneling current (high resistance state) typically flows when the directions of magnetization of the electrodes are anti-parallel. Thus, the resistance of the sensor is modulated by the intensity and direction of the external magnetic field.

The FM-I-FM tunneling sensor suffers from some drawbacks. First, the actual difference in coercivity between "hard" and "soft" transition metals can be relatively small, so these devices can display multiple switching (re-entrant) behavior in response to changes in the magnetic field intensity. The coercivity difference could possibly be increased by increasing the "hardness" of the "hard" ferromagnet by using rare earth materials. However, chemical reactivity during processing such materials can be a problem. Second, as with the GMR multilayer sensors, the maximum $\Delta R/R$ of the FM-I-FM tunneling sensors is about 25% at low temperatures and drops to about 10% at room temperature.

It is believed that the maximum $\Delta R/R$ of an FM-I-FM tunneling sensor is defined by the following equation:

$$\Delta R/R = \frac{2P_1 P_2}{1 + P_1 P_2} \tag{1}$$

where $P_i$ is the fractional spin polarization of the electrode $i$. It can be seen that for $\Delta R/R$ to approach 100%, $P_1$ and $P_2$ must both approach unity. In transition metals and their alloys, $P_i$ is less than 0.5. For example, for cobalt and cobalt-iron, it is 0.3 and 0.47, respectively.

The $P_i$ of transition metals and of rare earth elements does not approach unity because of the relatively low spin correlation of the electrons that provide the electrical conductivity of these elements. The magnetism of iron, cobalt and nickel is due to the 100% spin alignment of the ions. Each ion has a net spin that is the sum of the localized spins of the 3d electrons. The electrical conductivity of these elements, on the other hand, is due to itinerant 4s electrons. These itinerant electrons are only partially spin-correlated with the 3d electrons at any temperature, especially since the atomic configuration is actually $4s^2$.

The magnetism of rare earth metals is due to the extremely localized 4f electrons while the electrical conduction of these elements is due to $6s^2$ electrons. Consequently, the $P_i$ of rare earth metals does not approach unity either.

Thus, although magnetoresistive sensors appear superficially attractive as magnetic field sensors, none of the known magnetoresistive sensors can generate an electrical signal with a high signal-to-noise ratio in response to magnetic fields in the intensity range of 10s of Oe, typical of the intensity of the magnetic fields encountered in magnetic recording media such as discs and tapes. The electrical signals generated by known magnetoresistive sensors in response to magnetic fields in this intensity range have a low signal-to-noise ratio because the ΔR/R of such sensors does not exceed 10% at room temperature.

SUMMARY OF THE INVENTION

The invention provides a tunneling ferrimagnetic magnetoresistive sensor that has a ΔR/R much greater than that of known magnetoresistive sensors. With appropriate electrode materials, the tunneling ferrimagnetic magnetoresistive sensor according to the invention can undergo a substantial change in resistance in response to a magnetic field in the intensity range of 10s of Oe, which is typical of the intensity of the magnetic fields encountered in magnetic recording media such as discs and tapes.

A tunneling ferrimagnetic magnetoresistive sensor according to the invention is composed of a stack of thin-film layers, which include a layer of a ferrimagnetic material, a layer of a magnetic material, and a layer of an insulator interposed between the layer of the ferrimagnetic material and the layer of the magnetic material. The ferrimagnetic material is conductive. The magnetic material is also conductive and has a coercivity substantially different from that of the ferrimagnetic material. The insulating layer is of a thickness that is sufficiently small to permit tunneling of current carriers between the layer of the ferrimagnetic material and the layer of the magnetic material.

The layer of the magnetic material may be a layer of a ferromagnetic material, such as cobalt. This ferromagnetic material may have a coercivity less than or greater than that of the ferrimagnetic material. For example, in the former case, the layer of the ferrimagnetic material may include a high-coercivity form of magnetite and the layer of the magnetic material may include cobalt having a coercivity less than that of the high-coercivity form of magnetite. In the latter case, the layer of the ferrimagnetic material may include a low-coercivity form of magnetite and the layer of the magnetic material may include a ferromagnetic material having a coercivity greater than that of the low-coercivity form of magnetite. The low-coercivity form of magnetite may be cobalt-doped of the form $Fe_{3-x}Co_xO_4$, where $0.05 \leq x \leq 0.15$.

As a further alternative, the layer of the ferrimagnetic material may include a high-coercivity form of magnetite and the layer of the magnetic material may include a ferrimagnetic material having a lower coercivity than that of the high-coercivity form of magnetite.

In a yet further alternative, the layer of the ferrimagnetic material may have a low coercivity, and the layer of the magnetic material may include a ferrimagnetic material having a coercivity similar to that of the layer of the ferrimagnetic material. The effective coercivity of the layer of the magnetic material is made different from the coercivity of the layer of the ferrimagnetic material by a pinning layer additionally included in the stack. The pinning layer is a layer of a ferromagnetic or antiferromagnetic material having a coercivity greater than the coercivities of the ferrimagnetic material and the magnetic material. The pinning layer is disposed in the stack adjacent the layer of the magnetic material and remote from the layer of the insulator.

The layer of the insulator may include an insulating oxide, particularly aluminum oxide.

The invention also provides a first method of making a tunneling ferrimagnetic magnetoresistive sensor. In the method, a layer of one of a ferrimagnetic material and a magnetic material is deposited on the substrate as a first layer. A layer of an insulator is deposited on the first layer, and a layer of the other of the ferrimagnetic material and the magnetic material is deposited on the insulator as a second layer. The layer of the insulator is deposited with a thickness sufficiently small to permit tunneling of current carriers between the first layer and the second layer.

Magnetite may be deposited as the first layer, an insulating oxide may be deposited as the insulator, and cobalt may be deposited as the second layer.

A ferrimagnetic material having a coercivity substantially similar to that of the ferrimagnetic material deposited as the first layer may be deposited as the second layer and may be given an effective coercivity different from that of the first layer by depositing on the second layer a pinning layer of a ferromagnetic or antiferromagnetic material having a coercivity substantially greater than the coercivities of the first layer and the second layer.

Finally, the invention provides a second method of making a tunneling ferrimagnetic magnetoresistive sensor. In the method, a substrate on which a layer of ferric oxide is deposited is heated to reduce the layer of ferric oxide to a layer of magnetite. A layer of an insulator is formed on the layer of magnetite, and a layer of a magnetic material having a coercivity substantially different from the coercivity of the magnetite is deposited on the insulator. The layer of the insulator is formed with a thickness sufficiently small to permit tunneling of current carriers between the layer of magnetite and the layer of the magnetic material.

The layer of the insulator may be formed on the layer of the magnetite by depositing a layer of aluminum on the layer of ferric oxide. Then, when the substrate is heated to reduce the layer of ferric oxide to the layer of magnetite, free oxygen generated by the reduction of the ferric oxide oxidizes the layer of the aluminum to produce a pinhole-free layer of aluminum oxide as the layer of the insulator.

The substrate may have a layer of a mixture of ferric oxide and cobalt oxide deposited on it instead of the layer of ferric oxide. The mixture contains ferric oxide and cobalt oxide in such a ratio that, following the heating step, the magnetite is cobalt-doped and is of the form $Fe_{3-x}Co_xO_4$, where $0.05 \leq x \leq 0.15$.

The layer of the mixture of ferric oxide and cobalt oxide may be deposited on the substrate by mixing a spin-on solution of ferric oxide and a spin-on solution of cobalt oxide to form a mixed spin-on solution, spinning the mixed spin-on solution onto the substrate, and baking the substrate.

DETAILED DESCRIPTION OF THE INVENTION

The invention provides a number of different embodiments of a tunneling ferrimagnetic magnetoresistive sensor that generates an electrical signal with a high signal-to-noise ratio in response to a magnetic field. With suitable electrode materials, the tunneling ferrimagnetic magnetoresistive sensor according to the invention can generate the electrical signal in response to a magnetic field in the intensity range of 10s of Oe, which is typical of the intensity of the magnetic fields recorded on magnetic recording media such as discs and tapes. The tunneling ferrimagnetic magnetoresistive sensors according to the invention are also suitable for use in other applications involving magnetic field intensities in this range. Moreover, by using higher-coercivity electrode materials, tunneling ferrimagnetic magnetoresistive sensors according to the invention can also be made suitable for use in applications involving magnetic field intensities substantially greater than this range.

Figure 1:
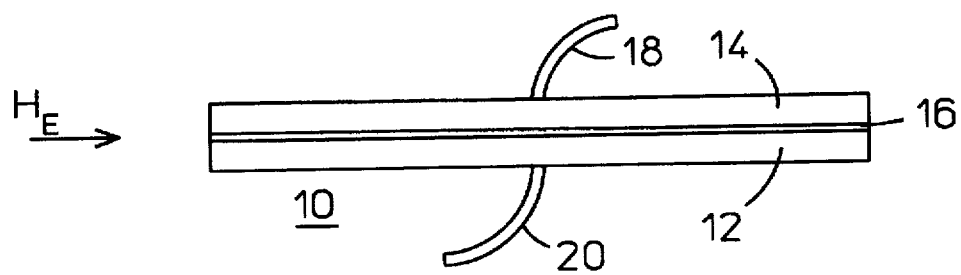
FIG. 1 is a view of a first embodiment of a tunneling ferrimagnetic magnetoresistive sensor according to the invention.

A first embodiment of a tunneling ferrimagnetic magnetoresistive sensor 10 according to the invention is shown in FIG. 1. In FIG. 1, the insulating layer 16, which is sufficiently thin to permit conduction by tunneling, is sandwiched between the ferrimagnetic electrode 12 and the magnetic electrode 14. The ferrimagnetic electrode and the magnetic electrode are made of materials having nonidentical coercivities $H_c$. The ferrimagnetic electrode is made of a conductive ferrimagnetic material. The magnetic electrode is made of a conductive magnetic material. Current is conducted transversely to the plane of the insulating layer from one electrode to the other by current carriers tunneling through the insulating layer.

The ferrimagnetic electrode 12 includes a layer of a ferrimagnetic material. A ferrimagnetic material is a material in which some ions have a magnetic moment antiparallel to others, but with incomplete cancellation, resulting in the material having magnetic properties. To enable the ferrimagnetic electrode to function as an electrode, the ferrimagnetic electrode must be made of an electrically-conductive ferrimagnetic material. Ferrites are ferrimagnetic materials that have the chemical formula $MO \cdot Fe_2O_3$, where M is a divalent cation, usually Zn, Cd, Fe, Ni, Cu, Co, or Mg. Most ferrites are insulators, but inverse spinel ferrite $Fe_3O_4$ is one of the few ferrimagnetic materials that also is a fair electrical conductor, and so is the preferred material of the ferrimagnetic electrode. Inverse spinel ferrite is also known as magnetite or black iron oxide, and is also written as $FeO \cdot Fe_2O_3$. Many spinel chalcogenides (sulfides) could also be used. Chromium dioxide ($CrO_2$) is an additional alternative.

The magnetic electrode 14 is a layer of a magnetic material having a coercivity different from that of the ferrimagnetic electrode 12. In a practical embodiment, a layer of cobalt, i.e., a ferromagnetic material, was used as the magnetic electrode 14. Alternative materials that may be used for the magnetic electrode 14 include iron-cobalt alloy, or a nickel-iron alloy such as permalloy. As a further alternative, the magnetic electrode 14 may be made of a ferrimagnetic material having a different effective coercivity from that of the ferrimagnetic material of the ferrimagnetic electrode 12. For example, cobalt-doped magnetite may be used for the magnetic electrode. Using a ferrimagnetic material for the magnetic electrode 14 as well as for the ferrimagnetic electrode 12 enables the sensor 10 to have a $\Delta R/R$ approaching 100%.

The insulating layer 16 is sandwiched between the ferrimagnetic electrode 12 and the magnetic electrode 14. The insulating layer must be sufficiently thin to permit current to flow between the ferrimagnetic electrode 12 and the magnetic electrode 14 by tunneling, and must be sufficiently thick to prevent current from flowing between the electrodes 12 and 14 by direct contact between the electrodes through pinholes in the insulating layer. The insulating layer can be a thin, pinhole-free layer of an insulating oxide, such as magnesium oxide, or another suitable insulating material. For example, hydrogenated amorphous silicon ($\alpha$-Si:H) could be used. In an all-epitaxial structure using synthetic magnetite and cobalt-doped synthetic magnetite as the electrodes, spinel ($MgAl_2O_4$) could be used as the insulating layer. However, as will be described below, several advantages are obtained by employing aluminum oxide as the insulating layer.

Electrical connections are made to the electrodes 12 and 14 by the conductors schematically represented by the conductors 18 and 20, respectively.

The magnetoresistive sensor 10 is operated with the external magnetic field either parallel to or perpendicular to the plane of the insulating layer 16. Current is conducted transversely to the plane of the insulating layer from one electrode to the other by tunneling through the insulating layer. The choice of the orientation of the insulating layer relative to the external magnetic field depends primarily on the direction of the magnetization axis of the ferrimagnetic material of the ferrimagnetic electrode 12. Other considerations include the geometry of the sensor.

When the tunneling ferrimagnetic magnetoresistive sensor 10 according to the invention is subject to an external magnetic field, the direction of magnetization of the electrode with the higher $H_c$ stays fixed relative to the external field whereas that of the electrode with the lower $H_c$ aligns itself to the direction of the external field. Because magnetization is a macroscopic manifestation of the electrons' spin alignment, and because tunneling is a spin-conserving process, the tunneling current depends on the relative orientation (parallel or antiparallel) of the directions of magnetization on opposite sides of the tunneling junction. A large tunneling current flows (low resistance state) when the directions of magnetization on opposite sides of the tunneling junction are in a first relative orientation, and a small tunneling current flows (high resistance state) when the directions of magnetization on opposite sides of the tunneling junction are in a second, opposite, relative orientation. Thus, the resistance of the sensor is modulated by the intensity and direction of the external magnetic field. The first relative orientation is antiparallel when the direction of magnetization is antiparallel to the direction of spin polarization in the material of one and only one of the electrodes. For example, in magnetite, the direction of magnetization is antiparallel to the direction of spin polarization, so the first relative orientation is antiparallel in a sensor in which the ferrimagnetic electrode is made of magnetite and the magnetic electrode is made of a ferromagnetic material such as cobalt, iron, nickel, or alloys of these metals.

The tunneling ferrimagnetic magnetoresistive sensor 10 according to the invention has several advantages compared with known FM-I-FM tunneling magnetoresistive sensors. The primary advantage is that using a ferrimagnetic material for one of the electrodes 12 and 14 of the tunneling ferrimagnetic magnetoresistive sensor according to the invention results in a $\Delta R/R$ of typically 50% at all temperatures, and using a ferrimagnetic material for both electrodes results in a $\Delta R/R$ that can be as high as 100%. In addition, materials with a significant difference in coercivity that can be used for the ferrimagnetic electrode 12 and the magnetic electrode 14 are readily available. This enables the sensor 10 to have a nearly non-hysteretic resistance versus magnetic field intensity characteristic. Finally, a number of materials having coercivities of the order of 10s of Oersteds are available for use as either the ferrimagnetic electrode or the magnetic electrode. This enables tunneling ferrimagnetic magnetoresistive sensors according to the invention to be used to reproduce magnetic recording media.

The maximum $\Delta R/R$ of the tunneling ferrimagnetic magnetoresistive sensor according to the invention is defined by the following equation:

$$\Delta R/R = \frac{2P_1P_2}{1+P_1P_2} \quad (2)$$

where $P_i$ is the fractional spin polarization of the electrode i.

Figure 2:
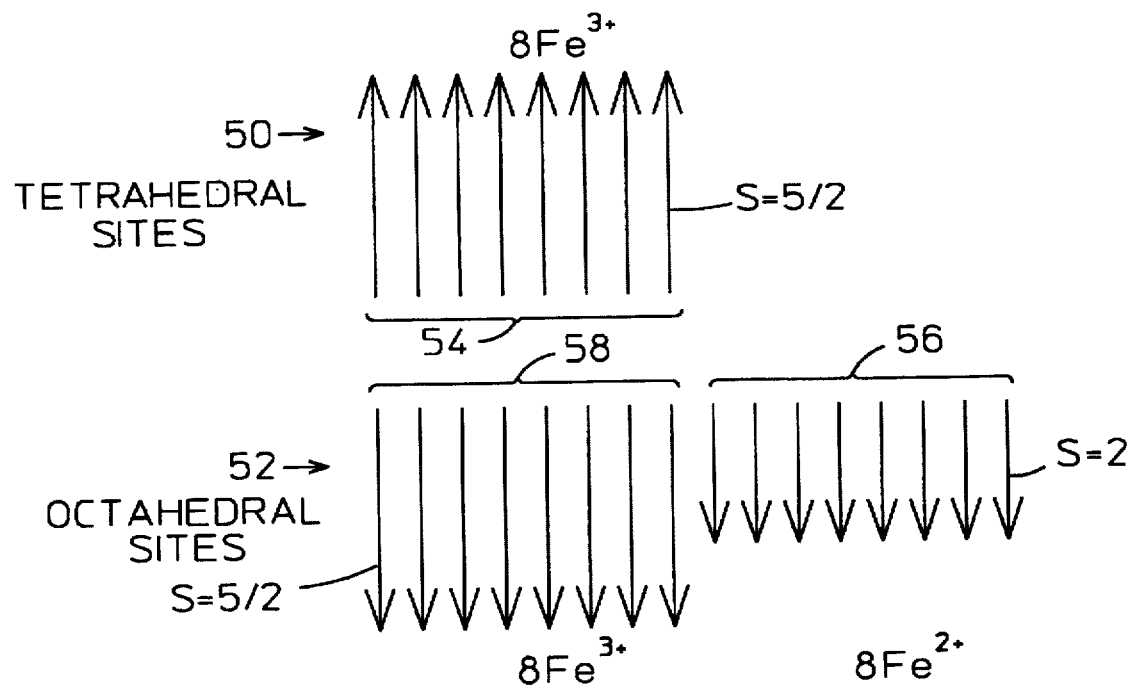
FIG. 2 schematically shows the ionic spin arrangement of the magnetite constituting the ferrimagnetic electrode of the tunneling ferrimagnetic magnetoresistive sensor according to the invention.

FIG. 2, derived from C. Kittel, INTRODUCTION TO SOLID STATE PHYSICS, 5th ed., John Wiley & Sons, New York, (1976) page 475, schematically shows the ionic spin arrangement of magnetite and illustrates the mechanism that gives magnetite its ferrimagnetic properties. A unit cube of a cubic ferrite such as magnetite has eight occupied tetrahedral sites 50 and 16 occupied octahedral sites 52. Magnetite actually has a so-called inverse spinel structure in which the tetrahedral sites are occupied exclusively by the $Fe^{3+}$ (ferric) ions 54 while the octahedral sites are occupied half by the $Fe^{2+}$ (ferrous) ions 56 and half by the $Fe^{3+}$ (ferric) ions 58.

Exchange interactions between the sites favor an antiparallel alignment of the spins connected by the interaction. Of the various possible interactions, those between the tetrahedral sites 50 and the octahedral sites 52 are strongest. To enable the spins in the tetrahedral sites to have an antiparallel alignment to the spins in the octahedral sites, the spins of all the ions 54 in the tetrahedral sites have to be parallel to one another and the spins of all the ions 56 and 58 in the octahedral sites have to be parallel to one another. As a result, the magnetic moments of the $Fe^{3+}$ ions 54 in the tetrahedral sites are anti-parallel to those of the $Fe^{3+}$ ions 58 in the octahedral sites, and therefore cancel. The magnetic properties are therefore defined only by the magnetic moments of the $Fe^{2+}$ ions 56.

Figure 3:
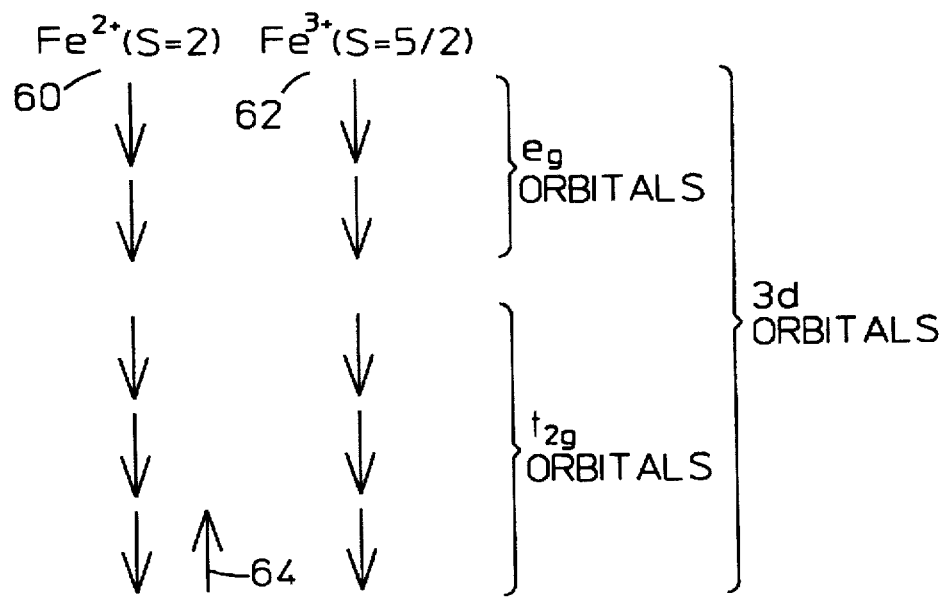
FIG. 3 shows the detailed electronic configurations of the $Fe^{2+}$ state and $Fe^{3+}$ state of the magnetite constituting the ferrimagnetic electrode of the tunneling ferrimagnetic magnetoresistive sensor according to the invention.

FIG. 3 shows the detailed electronic configurations of the $Fe^{2+}$ state 60 and $Fe^{3+}$ state 62 of magnetite. Magnetite is a fair electrical conductor ($\rho \approx 4$ m$\Omega$-cm at room temperature) because the lone spin-up electron 64 in one of the octahedral $Fe^{2+}$ sites can hop to a neighboring octahedral $Fe^{3+}$ site. The departure of the electron converts the former $Fe^{2+}$ site to a $Fe^{3+}$ site, while the arrival of the electron converts the formerly $Fe^{3+}$ site to a $Fe^{2+}$ site. The conservation of angular momentum and the Pauli exclusion principle cause the electron to remain spin-up at the new site. Moreover, conservation of angular momentum and the Pauli exclusion principle forbid the spin-up tetrahedral ferric sites 50 (FIG. 2) from being involved in this conduction mechanism—these oppositely-magnetized ions remain "bystanders."

Thus, although magnetite has ionic magnetization sublattices that have significant antiparallel components resulting from its being a ferrimagnetic material, electrical conduction in magnetite is performed exclusively by electrons having the same spin component, namely, the lone spin-up electrons 64 in the octahedral sites in the convention of FIG. 3. Thus, the relevant $P_i$ in equation (2) is the spin-polarization of the current-carrying electrons only, namely, the lone-spin-up electrons 64. As a result, $P_i$ is unity for magnetite.

Examination of equation (2) shows that the $\Delta R/R$ of the tunneling ferrimagnetic magnetoresistive sensor 10 according to the invention can approach 100% when the ferrimagnetic electrode 12 and the magnetic electrode 14 are both made of a conductive ferrimagnetic material such as magnetite, because both electrodes then have a $P_i$ of unity. Even when the magnetic electrode is made of a ferromagnetic material, such as cobalt, having a $P_i$ of much less than unity, the unity $P_i$ of the ferrimagnetic electrode gives the sensor a much greater $\Delta R/R$ than that of known magnetoresistive sensors. For example, with the magnetic electrode made of cobalt, which has a $P_i$ of 0.3, the tunneling ferrimagnetic magnetoresistive sensor according to the invention can have a $\Delta R/R$ as high as about 45%.

In the embodiment shown in FIG. 1, the ferrimagnetic electrode 12 preferably has a thickness between 100–1000 Å; the magnetic electrode 14 preferably has a thickness between 30–1000 Å; and the insulating layer 16 preferably has a thickness between 10–20 Å.

The activity of the tunneling ferrimagnetic magnetoresistive sensor according to the invention occurs in regions of the ferrimagnetic electrode 12 and the magnetic electrode 14 that are immediately adjacent the insulating layer 16. Thus, the thickness of the ferrimagnetic electrode and the magnetic electrode can be reduced to the order of 10 Å if the ferrimagnetic material and the magnetic material, respectively, is backed by a layer of a good electrical conductor, such as gold (see FIG. 5). This structure reduces the parasitic resistance of the electrodes. Backing the ferrimagnetic material and the magnetic material with a layer of a good electrical conductor is also preferred even when the layers of these materials are relatively thick.

Natural magnetite has a coercivity of about 10 Oe, so a tunneling ferrimagnetic magnetoresistive sensor having electrodes with a different coercivity can be made by forming the ferrimagnetic electrode 12 from natural magnetite and the magnetic electrode 14 from a ferromagnetic material such as cobalt, which has a coercivity of about 30 Oe.

As noted above, the $\Delta R/R$ of the tunneling ferrimagnetic magnetoresistive sensor according to the invention can be increased to close to 100% by making the magnetic electrode 14 also of a ferrimagnetic material. The coercivity of the ferrimagnetic material of the magnetic electrode 14 must be different from that of the ferrimagnetic material of the ferrimagnetic electrode 12. This can be achieved by using of a layer of synthetic magnetite as the ferrimagnetic electrode 12, and using a layer of natural magnetite as the magnetic electrode 14, for example. Synthetic magnetite has a coercivity of about 500 Oe, much greater than that of natural magnetite, as will be described in more detail below.

Alternatively and preferably, the ferrimagnetic electrode 12 may be a layer of synthetic magnetite, and the magnetic electrode 14 may be a layer of cobalt-doped synthetic magnetite, $Co_xFe_{3-x}O_4$, where $0.05 \leq x \leq 0.15$. Cobalt-doped synthetic magnetite has a coercivity similar to that of natural magnetite, but has the advantage that it can be controllably processed to determine the slope of its magnetization versus field intensity characteristic. In particular, as will be described in greater detail below with reference to FIGS. 8A and 8B, cobalt-doped synthetic magnetite can be controllably processed to give it a much steeper magnetization versus field intensity characteristic than natural magnetite. This characteristic has the advantage that a relatively small change in the field intensity will produce a large change in the magnetization of an electrode made of cobalt-doped synthetic magnetite.

Using synthetic magnetite and cobalt-doped synthetic magnetite on opposite sides of the insulating layer 16 in the tunneling ferrimagnetic magnetoresistive sensor 10 according to the invention results in a sensor that undergoes a large change of resistance in response to a magnetic field having an intensity of the order of 10 Oe. Such a sensor is well suited for reading magnetic storage media. The large change of resistance in response to a magnetic field having an intensity of the order of 10 Oe results from the sensor having ferrimagnetic materials on opposite sides of the insulating layer, which gives a ΔR/R close to 100%, and additionally results from the two ferrimagnetic materials having a large difference in coercivity, and the cobalt-doped synthetic magnetite having a coercivity of about 10 Oe and a steep magnetization versus field intensity characteristic.

Figure 4:
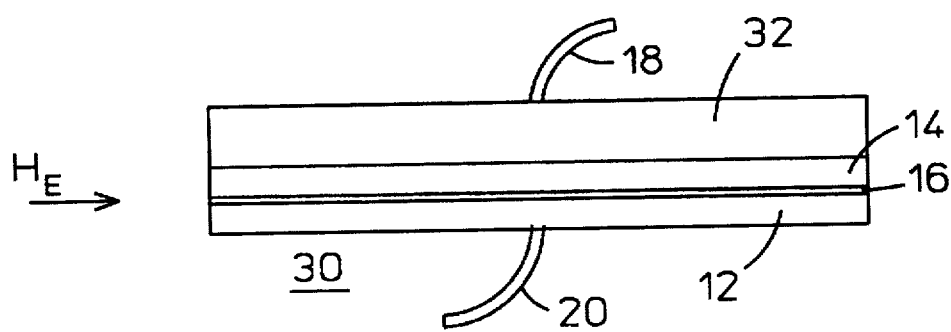
FIG. 4 is a view of a second embodiment of a tunneling ferrimagnetic magnetoresistive sensor according to the invention.

An alternative structure for a tunneling ferrimagnetic magnetoresistive sensor with ferrimagnetic materials having different effective coercivities on opposite sides of the insulating layer is shown in FIG. 4. This figure shows the tunneling ferrimagnetic magnetoresistive sensor 30 according to the invention. In this, the ferrimagnetic electrode 12 and the magnetic electrode 14 are made of different ferrimagnetic materials having similar coercivities, or are both made of the same ferrimagnetic material, but effectively have the substantially different coercivities required for the tunneling ferrimagnetic magnetoresistive sensor according to the invention to operate.

In the tunneling ferrimagnetic magnetoresistive sensor 30, the ferrimagnetic electrode 12 and magnetic electrode 14 are both made of ferrimagnetic materials having substantially similar coercivities. Preferably, the ferrimagnetic electrode 12 and the magnetic electrode 14 are both made of the same low-coercivity ferrimagnetic material, such as natural magnetite or cobalt-doped synthetic magnetite. The sensor 30 additionally includes the pinning layer 32 formed in contact with the magnetic electrode 14. The pinning layer 32 is a layer of a ferromagnetic material, such as iron, cobalt, or preferably an iron-cobalt alloy, or is a layer of an antiferromagnetic material, such as manganese-nickel. The material of the pinning layer has a coercivity substantially greater than that of the magnetic electrode 14.

Exchange coupling between the ferromagnetic or antiferromagnetic material of the pinning layer 32 and the magnetic electrode 14 "pins" the ferrimagnetic material of the magnetic electrode 14. As a result, the direction of magnetization of the magnetic electrode is not changed by an external magnetic field having sufficient intensity to switch the direction of magnetization of the ferrimagnetic electrode 12. Because of the presence of the pinning layer, the external magnetic field changes the direction of magnetization of only the ferrimagnetic electrode, while the direction of magnetization of the magnetic electrode remains unchanged. Thus, the presence of the external magnetic field will change the resistance of the tunneling ferrimagnetic magnetoresistive sensor 30 from its high-resistance state to its low-resistance state. Since the materials on opposite sides of the tunneling junction are the both ferrimagnetic materials with a $P_i$ of unity, the ΔR/R of the magnetoresistive sensor 30 is close to 100%.

Figure 5:
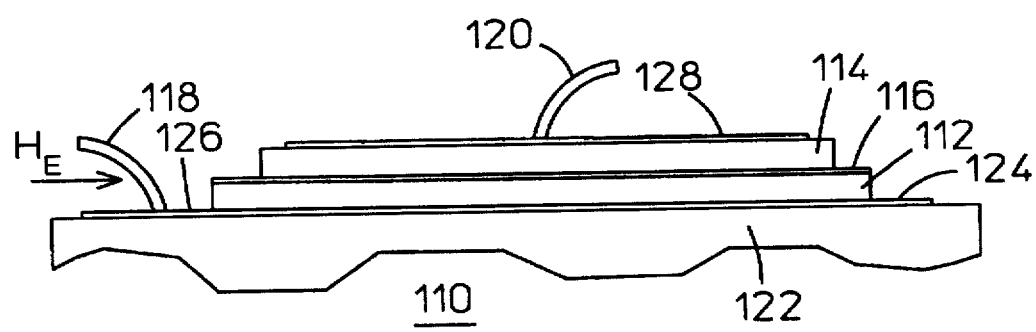
FIG. 5 is a view of a version of the first embodiment of the tunneling ferrimagnetic magnetoresistive sensor according to the invention in which the sensor is constructed by sequentially depositing layers of material on a substrate.

FIG. 5 shows a practical embodiment 110 of the tunneling ferrimagnetic magnetoresistive sensor 10 shown in FIG. 1. In FIG. 5, elements corresponding to those shown in FIG. 1 are indicated by the same reference numerals with 100 added.

The tunneling ferrimagnetic magnetoresistive sensor 110 is formed on the substrate 122, a layer of glass, silicon, or another suitable material. The first conductive layer 124 is deposited on the substrate to enable an electrical connection to be made to the ferrimagnetic electrode 112. The first conductive layer is preferably a layer of gold, but other good conductors, such as aluminum, may be used. The ferrimagnetic electrode 112 is then formed by depositing a thin layer of a ferrimagnetic material such as magnetite on part of the first conductive layer 124. The part of the first conductive layer on which the ferrimagnetic electrode is not deposited provides the bonding pad 126 to which the conductor 118 is later attached.

The surface of the ferrimagnetic electrode 112 is then covered by the insulating layer 116. The insulating layer may be, for example, a layer of an insulating oxide, such as magnesium oxide or aluminum oxide, and may be deposited, for example, by sputtering, laser ablation, or formation in situ. The insulating layer is formed with a thickness that is sufficiently thin to permit tunneling of current carriers through the layer, and is sufficiently thick to prevent physical contact, and hence leakage or shorting, between the ferrimagnetic electrode 112 and the magnetic electrode 114. A thickness of 12 Å was used in a practical embodiment.

The magnetic electrode 114 is, for example, a thin layer of a ferromagnetic material, such as cobalt or an iron-cobalt alloy, and may be deposited on the insulating layer 116 by evaporation, for example.

Finally, if necessary, the second conductive layer 128 may be deposited on the magnetic electrode 114 to aid connection of the conductor 120 to the magnetic electrode. Alternatively, the conductor 120 may be connected directly to the magnetic electrode, and the second conductive layer may be omitted.

A practical embodiment of the tunneling ferrimagnetic magnetoresistive sensor 30 shown in FIG. 4 may be structured similarly to the practical embodiment shown in FIG. 5, except that a ferrimagnetic material is deposited on the insulating layer 116 as the magnetic electrode 114 instead of a ferromagnetic material. An additional pinning layer (not shown) is then deposited on the magnetic electrode. This increases the effective coercivity of the ferrimagnetic material of the magnetic electrode, and gives the magnetic electrode an effective coercivity that is substantially different from the coercivity of the ferrimagnetic electrode.

Spin-on solutions that enable a thin film of ferric oxide to be deposited on a substrate are readily available from laboratory supply houses, so forming the ferrimagnetic electrode 112 by using such a commercially-available spin-on ferric oxide solution as the starting point is more convenient. This process is illustrated in FIGS. 6A–6D.

Figure 6A:
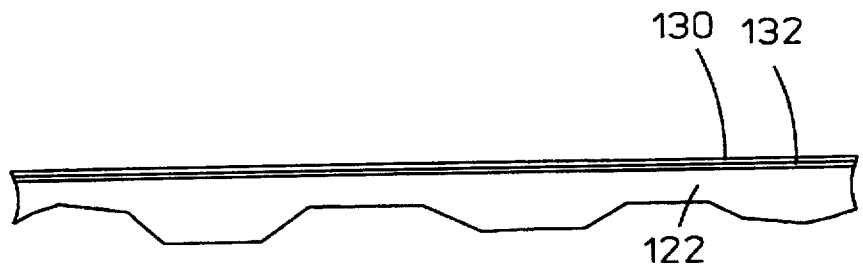
FIGS. 6A–6D illustrate a first method according to the invention of making a tunneling ferrimagnetic magnetoresistive sensor according to the invention.

FIGS. 6A–6D illustrate the process according to the invention of making the basic layer structure used for making tunneling ferrimagnetic magnetoresistive sensors according to the invention. FIG. 6A shows a piece of monocrystalline silicon as an example of the substrate 122. The surface of the substrate is oxidized to form the layer of silicon dioxide 132. The layer of metallization 130 is then deposited on the layer of silicon dioxide 132. Preferably, the layer of metallization 130 is composed of a thin layer of chromium (not shown) deposited on the silicon dioxide layer and a thick layer of gold (not shown) deposited on the layer of chromium. The layer of silicon dioxide and the layer of chromium help the layer of gold to adhere to the substrate 122.

Figure 6B:
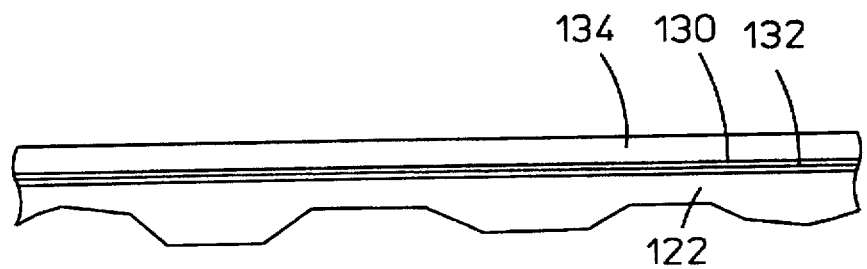

A solution of ferric oxide is then spun onto the surface of the layer of metallization 130. A suitable solution of ferric oxide may be obtained from Epoxy Technologies, Inc., of Billerica, Mass. The resulting structure is then baked in an oxidizing atmosphere at 400° C. to drive off the solvent from the ferric oxide solution. This leaves the layer of metallization covered with the uniform layer of ferric oxide 134, as shown in FIG. 6B. The layer of ferric oxide could alternatively be deposited by thermal evaporation or sputtering in an oxidizing atmosphere.

Figure 6C:
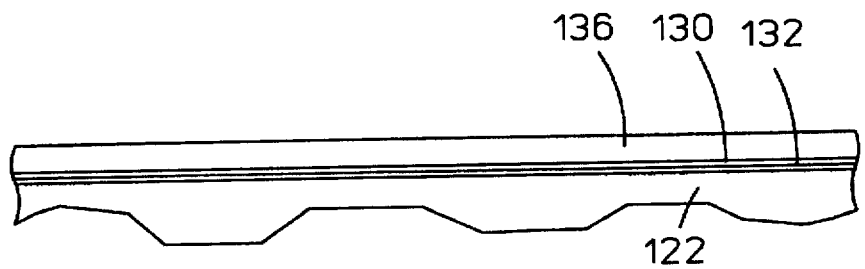

The structure is then heated in a vacuum or in a reducing atmosphere to reduce the layer of ferric oxide 134 to the layer of magnetite 136. The result of this step is shown in FIG. 6C. The heating process must be controlled to ensure that the entire layer of ferric oxide 134 is reduced to magnetite while preventing further reduction of the magnetite to ferrous oxide (FeO). In practice, this condition was obtained by heating at 400°–450° C. in a vacuum for about one hour. X-ray diffraction results indicated that heating in this manner fully reduced the ferric oxide to magnetite with a negligible production of ferrous oxide.

Figure 6D:
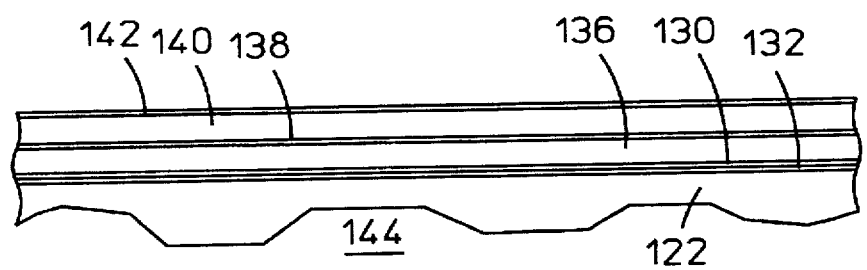

Once the layer of magnetite 136 has been formed as just described, the layer of insulator 138, the layer of magnetic material 140 and, optionally, the additional layer of metallization 142 may be successively deposited as described above with reference to FIG. 5 to provide the layer structure 144 shown in FIG. 6D. The layer structure is then subject to selective etching and cleaving, scribing, or dicing to form plural magnetoresistive sensors similar to the tunneling ferrimagnetic magnetoresistive sensor shown in FIG. 5. In this, the layer of metallization 130 provides the first conductive layer 124, the layer of magnetite 136 provides the ferrimagnetic electrode 112, the layer of insulator 138 provides the insulating layer 116, the layer of magnetic material 140 provides the magnetic electrode 114 and the additional layer of metallization 142 provides the second conductive layer 128.

The process just described for reducing ferric oxide to magnetite can also be used to simultaneously form the layer of insulator 138 on the layer of magnetite 136 by oxidation of a thin layer of aluminum deposited on the layer of ferric oxide 134. The layer of insulator formed in this manner has a more uniform thickness and, for a given thickness, has substantially fewer pinholes than a layer of an insulator deposited by sputtering or laser ablation on the layer of magnetite after the latter has been formed. A further advantage of forming the layer of insulator in this manner is that no oxygen is released from the layer of insulator when the layer of insulator is deposited. Oxygen can be released when sputtering or laser ablation is used to deposit an insulating oxide on the layer of magnetite to form the layer of insulator. This oxygen can oxidize part of the magnetite layer back to anti-ferromagnetic ferric oxide, which reduces the ΔR/R of the sensor. This problem is avoided when the layer of insulator is formed by oxidizing a layer of aluminum using the oxygen released by reducing ferric oxide to magnetite.

The process of simultaneously forming the layer of magnetite by reduction of the layer of ferric oxide and forming the layer of insulator by oxidizing a layer of aluminum is illustrated in FIGS. 6A, 6B and 7A–7D.

Figure 7A:
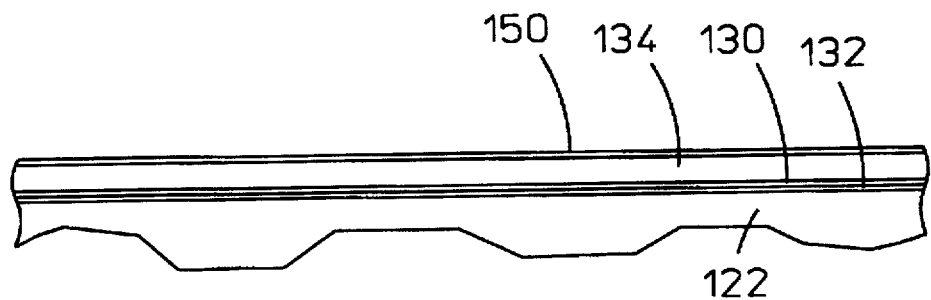
FIGS. 7A–7C illustrate parts of a second method according to the invention of making a tunneling ferrimagnetic magnetoresistive sensor according to the invention.

The layer of metallization 130 and the layer of ferric oxide 134 are successively deposited on the layer of silicon dioxide 132 formed on the surface of the substrate 122, as described above with reference to FIGS. 6A and 6B. After the substrate has been baked in an oxidizing atmosphere to drive off the solvents from the ferric oxide solution to form the layer of ferric oxide 134, the layer of aluminum 150 is deposited on the surface of the layer of ferric oxide, as shown in FIG. 7A. The layer of aluminum is preferably about 10 Å thick, and is preferably deposited by electron beam evaporation or by DC sputtering. Either of these deposition processes results in the aluminum thoroughly wetting the surface of the layer of ferric oxide, which ensures a lack of pinholes in the layer of insulator when this is eventually formed.

Figure 7B:
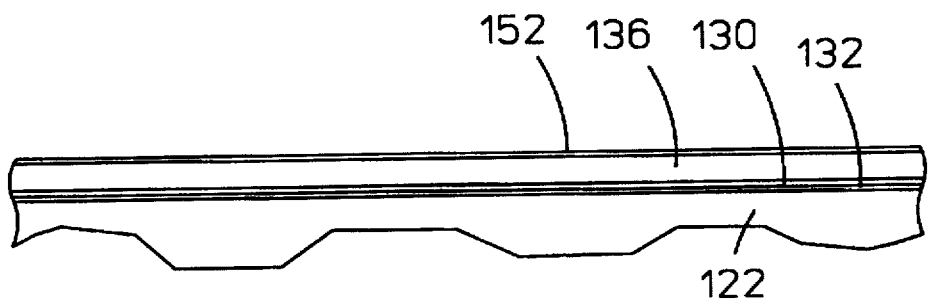

The substrate on which the above-described layers have been formed is then heated in a vacuum. Heating the layer of ferric oxide 134 reduces the ferric oxide to magnetite and releases free oxygen. The free oxygen diffuses out from the layer of ferric oxide into the layer of aluminum 150, where it oxidizes the aluminum to aluminum oxide $Al_2O_3$. By heating the substrate for sufficient time to reduce the whole of the layer of ferric oxide to magnetite, but not for so long as to reduce the magnetite further to ferrous oxide, sufficient free oxygen is released to oxidize the entire layer of aluminum 150 to aluminum oxide. FIG. 7B shows the substrate after the heating process with the layer of aluminum oxide 152 overlying the layer of magnetite 136. The layer of aluminum oxide 152 has the same advantages in terms of thickness uniformity and a lack of pinholes as the layer of aluminum 150 from which it was formed.

Figure 7C:
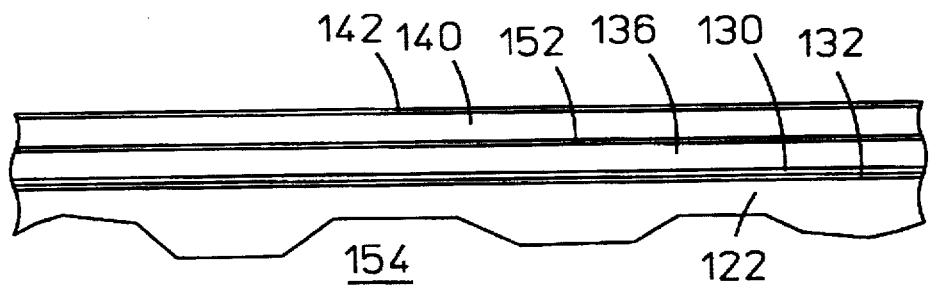

Once the layer of magnetite 136 and the layer of aluminum oxide 152 have been formed as just described, the layer of magnetic material 140 and, optionally, the additional layer of metallization 142 may be successively deposited to provide the layer structure 154 shown in FIG. 7C. The layer structure is then subject to selective etching and cleaving, scribing, or dicing to form plural tunneling ferrimagnetic magnetoresistive sensors similar to the tunneling ferrimagnetic magnetoresistive sensor shown in FIG. 5. In this, the layer of metallization 130 provides the first conductive layer 124, the layer of magnetite 136 provides the ferrimagnetic electrode 112, the layer of aluminum oxide 152 provides the insulating layer 116, the layer of magnetic material 140 provides the magnetic electrode 114 and the additional layer of metallization 142 provides the second conductive layer 128.

The synthetic magnetite formed by reduction of ferric oxide as described above has a coercivity of 500 Oe, compared with about 10 Oe for natural magnetite. However, the processes described above can be used to produce cobalt-doped synthetic magnetite, $Co_xFe_{3-x}O_4$, where $0.05 \leq x \leq 0.15$. Cobalt-doped synthetic magnetite has a coercivity closer to 10 Oe, and can also be made with a steep magnetization versus field intensity characteristic. These characteristics make cobalt-doped synthetic magnetite a suitable electrode material for use in making tunneling ferrimagnetic magnetoresistive sensors for reading magnetic storage media. Cobalt-doped synthetic magnetite is made by the processes described above with reference to FIGS.

6A–6D and 7A–7C, except that a ferric oxide spin-on solution is mixed with a cobalt oxide spin-on solution, and the resulting mixture is spun onto the layer of metallization 130 instead of a pure ferric oxide solution. The spin-on solutions are mixed in a ratio that provides a cation ratio in the range set forth above. Alternatively, a mixture of ferric oxide and cobalt oxide can be deposited by thermal evaporation or sputtering in an oxidizing atmosphere. The rest of the processing is performed as described above.

Figure 8A:
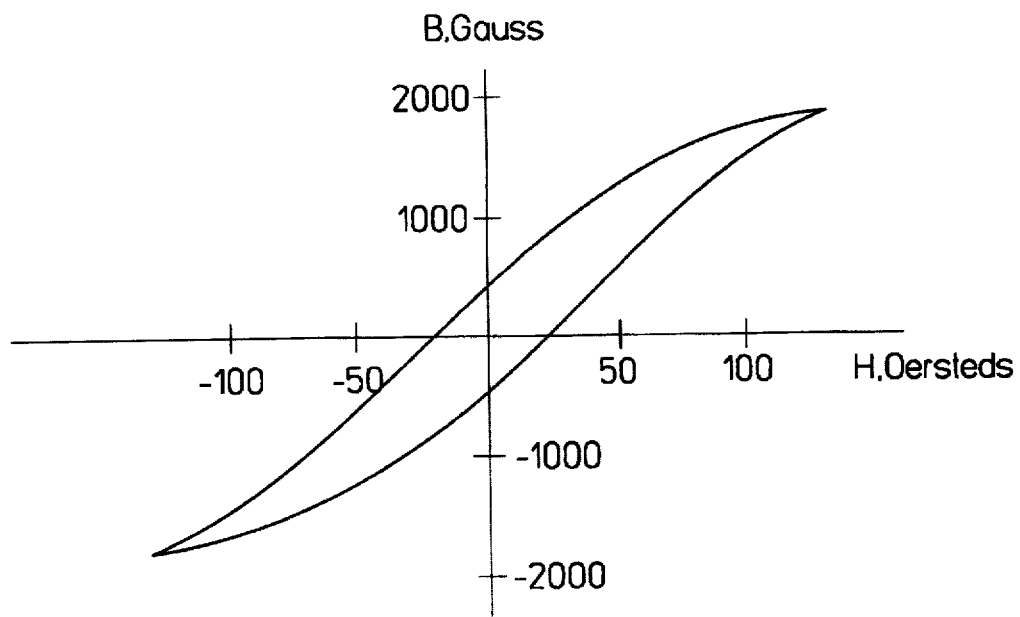
FIGS. 8A–8B show the hysteresis curves and characteristics of the ferrimagnetic magnetoresistive sensor according to the invention.
Figure 8B:
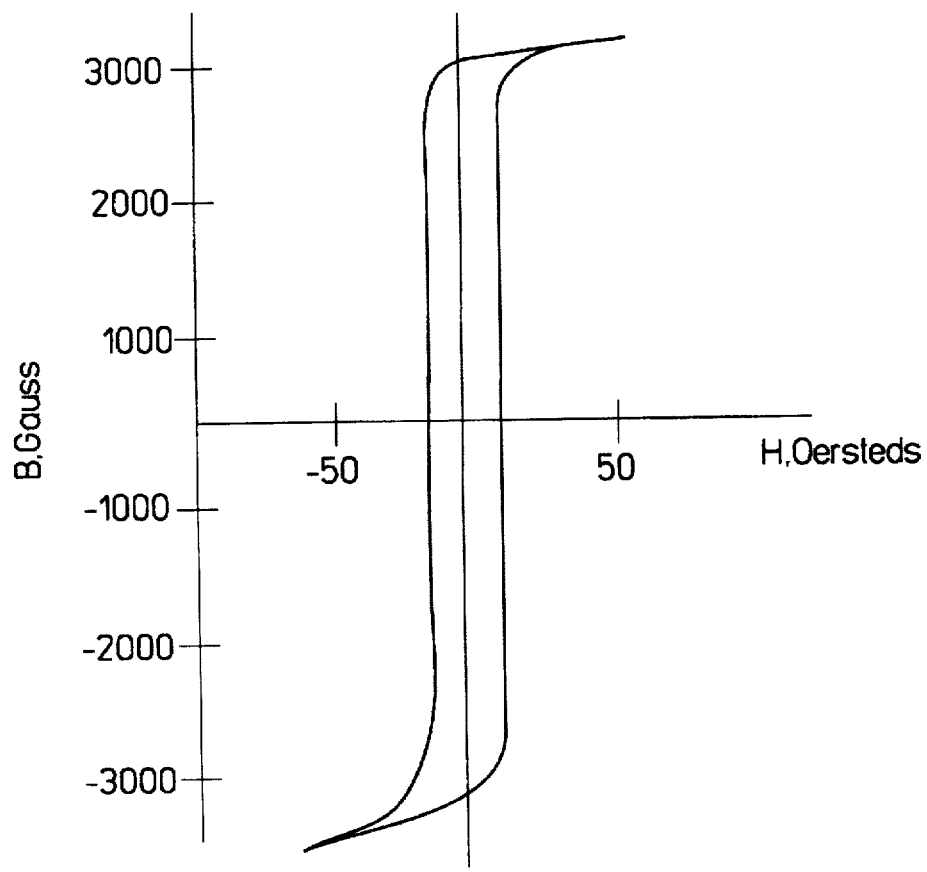

When the processing described above with reference to FIGS. 6A–6D and 7A–7C is carried out starting with a mixture of ferric oxide and cobalt oxide, the resulting layer of cobalt-doped synthetic magnetite has the soft hysteresis curve shown in FIG. 8A. Since the magnetization of this form of cobalt-doped synthetic magnetite changes relatively gradually in response to changes in field intensity, electrodes made of this form of cobalt-doped magnetite are suitable for use in tunneling ferrimagnetic magnetoresistive sensors for analog applications.

For applications that require a more square hysteresis curve, an additional step can be added to the processes described above to anneal the layer of cobalt-doped synthetic magnetite. Annealing the layer of cobalt-doped synthetic magnetite results in the square hysteresis characteristic shown in FIG. 8B, which includes a steep magnetization versus field intensity curve. It can be seen that, when this form of cobalt-doped synthetic magnetite is used as the material of one of the electrodes of the tunneling ferrimagnetic magnetoresistive sensor according to the invention, a magnetic field intensity of the order of 10 Oe causes a large change in the magnetization of the electrode. This results in a large change in the resistance of the sensor.

Although this disclosure describes illustrative embodiments of the invention in detail, it is to be understood that the invention is not limited to the precise embodiments described, and that various modifications may be practiced within the scope of the invention defined by the appended claims.

We claim:

1. A tunneling ferrimagnetic magnetoresistive sensor, comprising a stack of thin-film layers, the thin-film layers including:

a layer of a ferrimagnetic material, the ferrimagnetic material being conductive and having a coercivity;

a layer of a magnetic material, the magnetic material being conductive and having a coercivity substantially different from the coercivity of the ferrimagnetic material; and a layer of an insulator interposed between the layer of the ferrimagnetic material and the layer of the magnetic material, the layer of the insulator being of a thickness sufficiently small to permit tunneling of current carriers between the layer of the ferrimagnetic material and the layer of the magnetic material.

2. The sensor of claim 1, wherein the layer of the magnetic material includes a ferromagnetic material.

3. The sensor of claim 2, wherein:

the layer of the ferrimagnetic material includes a high-coercivity form of magnetite; and the layer of the magnetic material includes cobalt having a coercivity less than the coercivity of the high-coercivity form of magnetite.

4. The sensor of claim 2, wherein:

the layer of the ferrimagnetic material includes a low-coercivity form of magnetite; and the layer of the magnetic material includes a ferromagnetic material having a coercivity greater than the coercivity of the low-coercivity form of magnetite.

5. The sensor of claim 4, wherein the low-coercivity form of magnetite is cobalt-doped and is of the form $Fe_{3-x}Co_xO_4$, where x is in the range of $0.05 \leq x \leq 0.15$.

6. The sensor of claim 1, wherein:

the layer of the ferrimagnetic material includes a high-coercivity form of magnetite; and the layer of the magnetic material includes a ferrimagnetic material having a lower coercivity than the coercivity of the high-coercivity form of magnetite.

7. The sensor of claim 6, wherein the layer of the magnetic material includes cobalt-doped magnetite of the form $Fe_{3-x}Co_xO_4$, where x is in the range of $0.05 \leq x \leq 0.15$.

8. The sensor of claim 1, wherein:

the layer of the ferrimagnetic material has a low coercivity;

the layer of the magnetic material includes a ferrimagnetic material having a coercivity similar to the coercivity of the layer of the ferrimagnetic material; and the stack additionally includes a pinning layer of one of a ferromagnetic material and an antiferromagnetic material, the one of the ferromagnetic material and the antiferromagnetic material having a coercivity greater than the coercivities of the ferrimagnetic material and the magnetic material, the pinning layer being disposed in the stack adjacent the layer of the magnetic material and remote from the layer of the insulator.

9. The sensor of claim 1, wherein the layer of the insulator includes an insulating oxide.

10. The sensor of claim 9, wherein the layer of the insulator includes aluminum oxide.

11. The sensor of claim 1, wherein at least one of the layer of the ferrimagnetic material and the layer of the magnetic material is backed by a layer of a better electrical conductor.

12. A method of making a tunneling ferrimagnetic magnetoresistive sensor, the method comprising steps of:

providing a substrate, a conductive ferrimagnetic material, a conductive magnetic material, and an insulator;

depositing a layer of one of the ferrimagnetic material and the magnetic material on the substrate as a first layer;

depositing a layer of the insulator on the first layer; and depositing a layer of the other of the ferrimagnetic material and the magnetic material on the insulator as a second layer, wherein:

in the step of depositing the layer of the insulator, the insulator is deposited with a thickness sufficiently small to permit tunneling of current carriers between the first layer and the second layer.

13. The method of claim 12, wherein:

in the step of depositing the layer of the one of the ferrimagnetic material and the magnetic material as the first layer, magnetite is deposited;

in the step of depositing the layer of the insulator, an insulating oxide is deposited; and in the step of depositing the layer of the other of the ferrimagnetic material and the magnetic material as the second layer, cobalt is deposited.

14. The method of claim 12, wherein:

in the providing step, a first ferrimagnetic material having a first coercivity is provided as the ferrimagnetic material, a second ferrimagnetic material having a second coercivity substantially similar to the first coercivity is provided as the magnetic material, and one of a ferromagnetic material and an antiferromagnetic material, the one of the ferromagnetic material and the antiferromagnetic material having a coercivity substantially greater than the first coercivity and the second coercivity is additionally provided;

in the step of depositing the layer of the one of the ferrimagnetic material and the magnetic material on the substrate as the first layer, the ferrimagnetic material is deposited; and the method additionally comprises a step of depositing a pinning layer of the one of the ferromagnetic material and the antiferromagnetic material on the second layer.

15. A method of making a tunneling ferrimagnetic magnetoresistive sensor, the method comprising steps of:

providing:

a substrate having a layer of ferric oxide deposited thereon, an insulator, and a magnetic material having a coercivity;

heating the substrate having the layer of the ferric oxide thereon to reduce the layer of ferric oxide to a layer of magnetite, the magnetite having a coercivity substantially different from the coercivity of the magnetic material;

forming a layer of the insulator on the layer of magnetite; and depositing a layer of the magnetic material on the insulator, wherein:

in the step of forming the layer of the insulator, the layer of the insulator is formed with a thickness sufficiently small to permit tunneling of current carriers between the layer of magnetite and the layer of the magnetic material.

16. The method of claim 15, wherein, in the step of forming the layer of the insulator, an insulating oxide is deposited on the layer of magnetite.

17. The method of claim 15, wherein the layer of the insulator is formed on the layer of magnetite by steps including:

providing aluminum;

depositing a layer of the aluminum on the layer of ferric oxide; and performing the step of heating the substrate to reduce the layer of ferric oxide to the layer of magnetite, the reduction of the ferric oxide to magnetite generating free oxygen that oxidizes the layer of the aluminum to produce a pinhole-free layer of aluminum oxide as the layer of the insulator.

18. The method of claim 17, wherein the step of providing a substrate having a layer of ferric oxide deposited thereon provides the substrate having a layer of a mixture of ferric oxide and cobalt oxide deposited thereon, the mixture containing ferric oxide and cobalt oxide in such a ratio that, following the heating step, the magnetite is cobalt-doped and is of the form $Fe_{3-x}Co_xO_4$, where $0.05 \leq x \leq 0.15$.

19. The method of claim 18, wherein the step of providing the substrate having a layer of a mixture of ferric oxide and cobalt oxide deposited thereon includes steps of:

providing the substrate, a spin-on solution of ferric oxide, and a spin-on solution of cobalt oxide;

mixing the spin-on solution of the ferric oxide and the spin-on solution of the cobalt oxide to form a mixed spin-on solution;

spinning the mixed spin-on solution onto the substrate; and baking the substrate.

20. The method of claim 15, wherein, in the step of depositing the layer of the magnetic material, cobalt is deposited.

21. The method of claim 15, wherein:

the heating step reduces the ferric oxide to a high-coercivity form of magnetite; and in the step of depositing a magnetic material, a low-coercivity form of magnetite is deposited.

22. The method of claim 21, wherein, in the step of depositing a magnetic material, the low-coercivity form of magnetite is cobalt-doped magnetite of the form $Fe_{3-x}Co_xO_4$, where $0.05 \leq x \leq 0.15$.

23. The method of claim 15, wherein the step of providing a substrate having a layer of ferric oxide deposited thereon provides the substrate having a layer of a mixture of ferric oxide and cobalt oxide deposited thereon, the mixture containing ferric oxide and cobalt oxide in such a ratio that, following the heating step, the magnetite is cobalt-doped and is of the form $Fe_{3-x}Co_xO_4$, where $0.05 \leq x \leq 0.15$.

24. The method of claim 23, wherein the step of providing the substrate having a layer of a mixture of ferric oxide and cobalt oxide deposited thereon includes steps of:

providing the substrate, a spin-on solution of ferric oxide, and a spin-on solution of cobalt oxide;

mixing the spin-on solution of the ferric oxide and the spin-on solution of the cobalt oxide to form a mixed spin-on solution;

spinning the mixed spin-on solution onto the substrate; and baking the substrate.

\* \* \* \* \*